United States Patent
Hsu et al.

(10) Patent No.: US 8,580,694 B2
(45) Date of Patent: Nov. 12, 2013

(54) METHOD OF PATTERNING HARD MASK LAYER FOR DEFINING DEEP TRENCH

(75) Inventors: Sheng-Jie Hsu, Taichung (TW); Shin-He Siao, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 154 days.

(21) Appl. No.: 13/218,281

(22) Filed: Aug. 25, 2011

(65) Prior Publication Data
US 2013/0052831 A1  Feb. 28, 2013

(51) Int. Cl.
*H01L 21/76* (2006.01)

(52) U.S. Cl.
USPC .............. 438/738; 438/743; 438/744

(58) Field of Classification Search
USPC .................. 438/738, 743, 744; 257/E21.252
See application file for complete search history.

(56) References Cited

U.S. PATENT DOCUMENTS

| 6,485,988 | B2 | 11/2002 | Ma et al. | |
|---|---|---|---|---|
| 6,664,191 | B1 * | 12/2003 | Kim et al. | 438/700 |
| 6,743,732 | B1 * | 6/2004 | Lin et al. | 438/706 |
| 7,067,434 | B2 | 6/2006 | Colombo et al. | |
| 7,582,567 | B1 * | 9/2009 | Syau et al. | 438/706 |
| 7,989,350 | B2 * | 8/2011 | Kim | 438/706 |
| 2004/0063331 | A1 * | 4/2004 | Mori et al. | 438/714 |
| 2008/0191271 | A1 * | 8/2008 | Yagishita et al. | 257/327 |
| 2010/0248491 | A1 * | 9/2010 | Sun et al. | 438/717 |

* cited by examiner

*Primary Examiner* — Kevin Parendo
(74) *Attorney, Agent, or Firm* — J.C. Patents

(57) ABSTRACT

A method of patterning a hard mask layer for defining a deep trench is described. A substrate formed with an isolation structure therein is provided. A hard mask layer is formed over the substrate provided. A patterned photoresist layer is formed over the hard mask layer, having therein a deep-trench opening pattern over the isolation structure. An etching gas not containing hydrogen is used to etch the hard mask layer with the patterned photoresist layer as a mask and thereby transfer the deep-trench opening pattern to the hard mask layer.

4 Claims, 2 Drawing Sheets

METHOD OF PATTERNING HARD MASK LAYER FOR DEFINING DEEP TRENCH

BACKGROUND OF THE INVENTION

1. Field of Invention

This invention relates to an integrated circuit (IC) fabricating process, and more particularly relates to a method of patterning a hard mask layer for defining a deep trench.

2. Description of Related Art

In the IC technology, there are many cases where a device is formed in a deep trench in the substrate to save the circuit area. For example, the capacitors of the memory cells of embedded DRAM can be formed in deep trenches in a substrate.

The deep trenches are usually defined by a hard mask layer for having a large depth. The hard mask layer usually includes silicon nitride (SiN), which can be etched by an etching gas containing fluorohydrocarbons, such as $CHF_3$ and $CH_2F_2$. However, when such etching gas is used, the chamber wall has a severe polymer deposition issue so that the chamber has to be maintained frequently.

SUMMARY OF THE INVENTION

To solve the polymer issue, this invention provides a method of patterning a hard mask layer for defining a deep trench.

The method of patterning a hard mask layer for defining a deep trench of this invention is described below. A substrate formed with an isolation structure therein is provided. A hard mask layer is formed over the substrate provided. A patterned photoresist layer is formed over the hard mask layer, having therein a deep-trench opening pattern over the isolation structure. An etching gas not containing hydrogen is used to etch the hard mask layer with the patterned photoresist layer as a mask and thereby transfer the deep-trench opening pattern to the hard mask layer.

In some embodiment, the hard mask layer includes at least one silicon compound. The etching gas for such a hard mask layer may include at least one perfluorocarbon compound, and may further include argon (Ar) and $O_2$. The at least one perfluoro-carbon compound may be selected from the group consisting of $CF_4$, perfluorobutene ($C_4F_8$) and perfluoropentyne ($C_5F_8$). The at least one silicon compound may include silicon nitride (SiN). The hard mask layer may include a first SiN layer, a silicon oxide buffer layer on the first SiN layer, and a second SiN layer on the buffer layer.

Since the etching gas used in the patterning method of this invention does not contain hydrogen, the polymer formation is greatly inhibited so that the frequency of the maintenance of the reaction chamber can be decreased.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit the scope of this invention.

Figure 1:
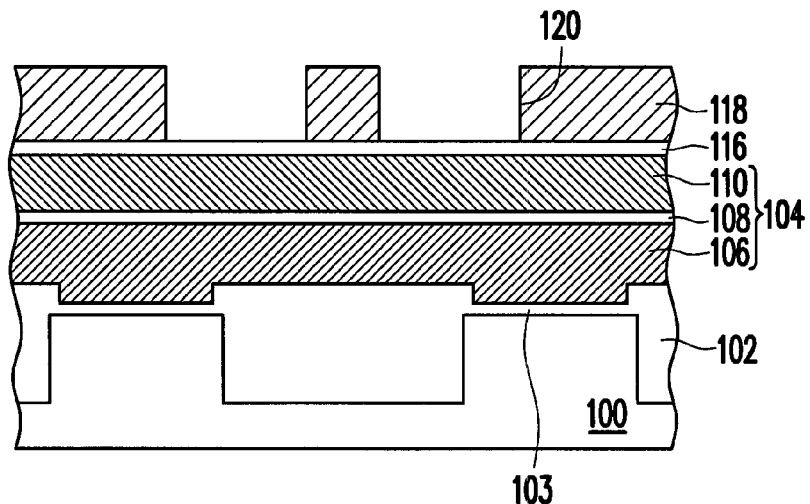
FIGS. 1-2 illustrate, in a cross-sectional view, a method of patterning a hard mask layer for defining a deep trench according to an embodiment of this invention.
Figure 2:
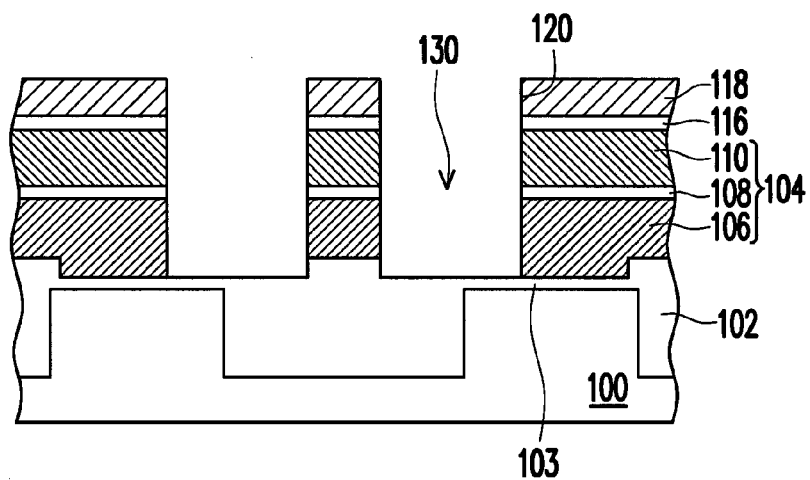

FIGS. 1-2 illustrate, in a cross-sectional view, a method of patterning a hard mask layer for defining a deep trench according to an embodiment of this invention.

Referring to FIG. 1, a substrate 100 is provided, which has been formed with an isolation structure 102 therein and a pad oxide layer 103 thereon that is retained after the forming process of the isolation structure 102. The substrate 100 may be a single-crystal silicon substrate. The isolation structure 102 may be a shallow trench isolation (STI) structure, and may include CVD oxide. A hard mask layer 104 is formed over the substrate 100, covering the isolation structure 102 and the pad oxide layer 103. The hard mask layer 104 possibly includes a first SiN layer 106, a silicon oxide (SiO) buffer layer 108 on the first SiN layer 106, and a second SiN layer 110 on the SiO buffer layer 108. The first SiN layer 106 and the second SiN layer 110 may have substantially the same thickness, e.g., 1300-1700 angstroms. The thickness of the SiO buffer layer 108 may be 100-300 angstroms. The hard mask layer 104 may alternatively include only a single SiN layer.

Then, a bottom anti-reflection coating (BARC) 116 and a patterned photoresist layer 118 are formed over the hard mask layer 104, wherein the patterned photoresist layer 118 has therein a deep-trench opening pattern 120 over the isolation structure 102. The thickness of the patterned photoresist layer 118 may be 3900-4500 angstroms.

Referring to FIG. 2, the BARC 116 and the hard mask layer 104 are subjected to anisotropic etching, using the patterned photoresist layer 118 as a mask with a plasma generated from an etching gas, to transfer the deep-trench opening patterns 120 to the hard mask layer 104, i.e., to form deep-trench opening patterns 130 in the second SiN layer 110, the SiO buffer layer 108 and the first SiN layer 106. The etching does not contain hydrogen, may include at least one perfluorocarbon compound, and may further include argon (Ar) and further include $O_2$ in option. Since $O_2$ can increase the etching selectivity between the material intended to be etched and the material not intended to be etched, the etching profile can be controlled better by including $O_2$ in the etching gas. The at least one perfluorocarbon compound may be selected from the group consisting of $CF_4$, perfluorobutene ($C_4F_8$) and perfluoropentyne ($C_5F_8$).

In the above etching process, the etching recipe for the second SiN layer 110 can be different from that for the SiO buffer layer 108 and the first SiN layer 106, wherein the RF power and Ar flow rate in the latter recipe is several times higher than those in the former recipe to enhance the physical bombardment.

In an example of the above etching process, the etching recipe for the second SiN layer 110 includes: pressure=40-60 mTorr, RF power=500-700 W, $C_4F_8$ flow rate=9-15 sccm, Ar flow rate=50-150 sccm, and $O_2$ flow rate=10-30 sccm; the etching recipe for the SiO buffer layer 108 and the first SiN layer 106 includes: pressure=40-60 mTorr, RF power=1300-1700 W, $C_4F_8$ flow rate=9-15 sccm, Ar flow rate=100-400 sccm, and $O_2$ flow rate=10-30 sccm.

Since the etching gas used in the patterning method of the above embodiment of this invention does not contain hydrogen, the polymer formation is greatly inhibited so that the frequency of the maintenance of the reaction chamber can be decreased.

Figure 3:
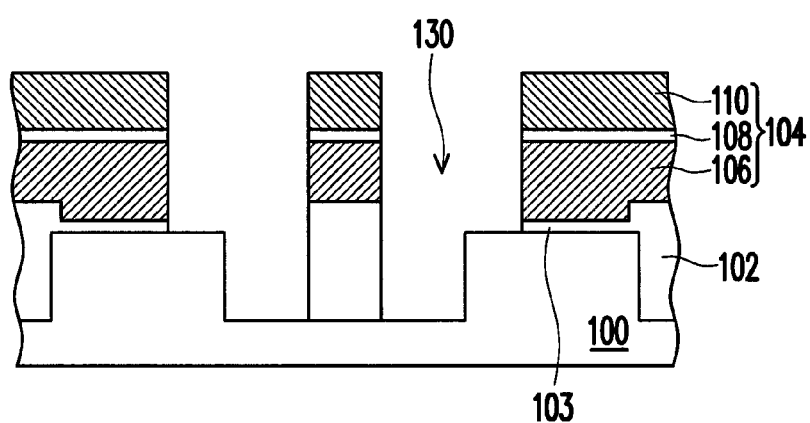
FIGS. 3-4 illustrate, in a cross-sectional view, the subsequent steps for forming the deep trench according to the embodiment of this invention.
Figure 4:
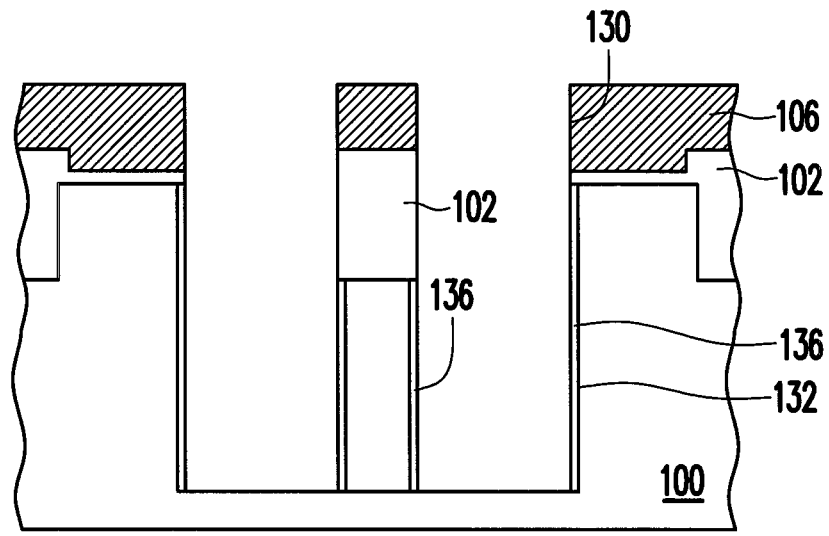

FIGS. 3-4 illustrate, in a cross-sectional view, the subsequent steps for forming the deep trench according to the embodiment of this invention.

Referring to FIG. 3, the isolation structure 102 and the pad oxide layer 103 are etched using the patterned photoresist layer 118 and the patterned hard mask layer 104 as a mask to remove the portions of the isolation structure 102 and the pad oxide layer 103 exposed in the deep-trench opening patterns 130. In addition to at least one perfluorocarbon compound, Ar and $O_2$ as mentioned above, the etching gas used in this etching process may further include carbon monoxide (CO) in option to prevent termination of the etching reaction.

Referring to FIGS. 3-4, the substrate 100 is etched using the pattern hard mask layer 104 as a mask to form deep trenches 132 in the substrate 100. At the end of the etching process, only the first SiN layer 106 remains as a part of the hard mask layer 104. An insulating layer 136 is formed on the sidewall of each deep trench 132, possibly by performing thermal oxidation to form an oxide layer at the bottom and the sidewall of each deep trench 132 and then performing anisotropic etching to remove the portion of the oxide layer at the bottom of each deep trench 132.

Figure 5:
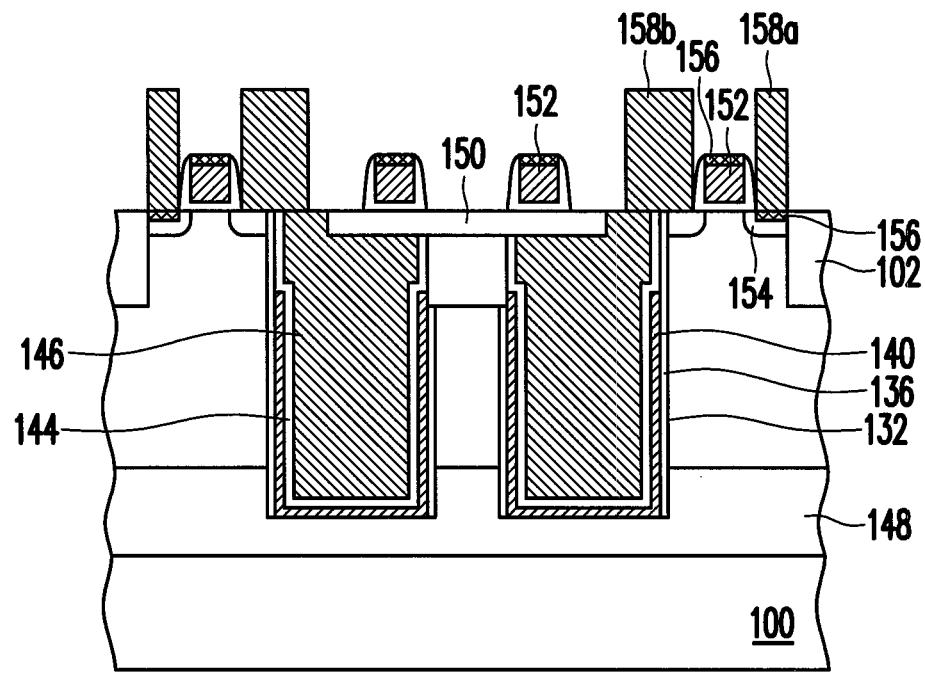
FIG. 5 illustrates, in a cross-sectional view, the subsequent steps for finishing the DRAM cells according to the embodiment of this invention.

FIG. 5 illustrates, in a cross-sectional view, the subsequent steps for finishing the DRAM cells according to the embodiment of this invention.

Referring to FIG. 5, the outer electrode 140, the dielectric layer 144 and the inner electrode 146 of a capacitor are sequentially formed in each deep trench 132, the SiN layer 106 is removed, and then a deep well 148 electrically connected with each outer electrode 140, an insulating pad 150 partially embedded in the inner electrodes 146, word lines 152, source/drain (S/D) regions 154, a self-aligned silicide (salicide) layer 156, S/D contacts 158a and share contacts 158b are formed.

Though in the above embodiment of this invention the hard mask layer being patterned is for defining deep trenches of the capacitors of DRAM cells, the patterning method of this invention is not limited to pattern such a hard mask layer, and may alternatively used to pattern a hard mask layer for defining the deep trenches of other devices.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of patterning a hard mask layer for defining a trench, comprising:
    providing a substrate formed with a shallow trench isolation (STI) structure therein;
    forming a hard mask layer over the substrate, wherein the hard mask layer comprises a first silicon nitride (SiN) layer, a silicon oxide buffer layer on the first SiN layer, and a second SiN layer on the silicon oxide buffer layer, the first SiN layer and the second SiN layer have substantially the same thickness in a range of 1300-1700 Angstroms, and a thickness of the silicon oxide buffer layer is in a range of 100-300 Angstroms;
    forming, over the hard mask layer, a patterned photoresist layer having therein a trench opening pattern over the shallow trench isolation structure;
    using an etching gas not containing hydrogen to etch the hard mask layer with the patterned photoresist layer as a mask and thereby transfer the trench opening pattern to the hard mask layer and
    etching the shallow trench isolation structure and the substrate, with the patterned hard mask layer as a mask, to form a trench in the substrate.

2. The method of claim 1, wherein the etching gas comprises at least one perfluorocarbon compound.

3. The method of claim 2, wherein the at least one perfluorocarbon compound is selected from the group consisting of $CF_4$, perfluorobutene ($C_4F_8$) and perfluoropentyne ($C_5F_8$).

4. The method of claim 2, wherein the etching gas further comprises Ar and $O_2$.

* * * * *